United States Patent [19]
Lee et al.

[11] Patent Number: 6,008,974
[45] Date of Patent: Dec. 28, 1999

[54] ELECTROSTATIC DISCHARGE PROTECTIVE CIRCUIT FOR REDUCING AN UNDESIRED CHANNEL TURN-ON

[75] Inventors: Jian-Hsing Lee, Pu Tzu; Yi-Hsun Wu, Taipei; Jiaw-Ren Shih, Tou Liu; Jing-Meng Liu, Hsinchu, all of Taiwan

[73] Assignee: Taiwan Semiconductor Manufacturing Co., Ltd., Hsinchu, Taiwan

[21] Appl. No.: 09/188,178

[22] Filed: Nov. 9, 1998

[51] Int. Cl.$^6$ ...................................................... H02H 3/22
[52] U.S. Cl. .............................. 361/111; 361/56; 361/91.5
[58] Field of Search ................................. 361/56, 91, 111, 361/91.5, 91.1

[56] References Cited

U.S. PATENT DOCUMENTS 5,610,790  3/1997  Staab et al. ................................ 361/56

*Primary Examiner*—Michael J. Sherry
*Attorney, Agent, or Firm*—Harold L. Novick; Gregory B. Kang; Nath & Associates

[57] ABSTRACT

An electrostatic discharge (ESD) protective circuit for reducing the electron-tunneling phenomena in NMOS devices. Several complementary metal oxide semiconductor (CMOS) devices act as an ESD protective circuit from being destroyed. The CMOS devices are connected to an internal circuit and a power line provide a bias voltage for the devices. The drains of the CMOS devices are connected to a pad to output a driving current. A NMOS device is connected between the internal circuit and the ESD protective circuit for protecting the NMOS devices in the circuit. As an ESD pulse is input into the ESD protective circuit, the NMOS device is then turned on by the pulse. Thus, positive charges on the gate of the NMOS devices in the ESD circuit is conducted into ground. Therefore, the NMOS device between the internal circuit and the ESD circuit can prevent the gate oxide of the NMOS device in the circuit from damage.

14 Claims, 6 Drawing Sheets

ELECTROSTATIC DISCHARGE PROTECTIVE CIRCUIT FOR REDUCING AN UNDESIRED CHANNEL TURN-ON

FIELD OF THE INVENTION

The present invention relates to an electrostatic discharge (ESD) protective circuit of integrated circuits, and more specifically, to an ESD protective circuit of integrated circuits that can reduce the undesired channel turn-on of an NMOS device in the ESD circuit.

BACKGROUND OF THE INVENTION

With the advent of the technology to fabricate integrated circuits, it becomes a trend to scale down the geometry size of semiconductor devices and increases the density of semiconductor devices per unit area of a silicon wafer. Electrostatic discharge (ESD) protection is an important issue for the design of integrated circuits. Electrostatic discharge is also a significant problem of the fabrication of integrated circuits. Such as, human or machine handling of the semiconductor wafer or chip during the assembly or processing of a wafer could produce electrostatic charges in integrated circuits. These electrostatic charges will cause destructive electrostatic pulse to destroy devices in integrated circuits.

As the development in the formation of sub-micron semiconductor technologies has been quite modest in comparison, the thickness of the gate oxide and the length of the device's channel have become thinner or shorter than ever. The failure susceptibility of integrated circuits to ESD protection increases due to the IC fabrication towards submicron feature lengths.

Typically, input/output signals to a metal oxide semiconductor (MOS) are input into or output from input/output pads. The input/output pads are generally connected to the gates of MOS devices. All pins for input/output of MOS IC must be protected by ESD protective circuits to prevent harmful static discharge voltages from damaging the IC.

Referring to FIG. 1, it is demonstrated an electrostatic discharge (ESD) circuit of integrated circuits. The ESD circuit is consisted of several first pairs that each of the first pairs further comprises a used NMOS device and a used PMOS device, and several second pairs, that each of the second pairs further comprises a unused NMOS device and a unused PMOS device. The ESD circuit is connected between an internal circuit 2000 and a pad 1000.

Referring to FIG. 1 again, a used PMOS device P1 and a used NMOS device N1 are connected together for discharging. Besides, a used PMOS device P2 and a used NMOS device N2 are coupled together for discharging. In detail, the gates of the PMOS P1, the NMOS N1, the PMOS P2 and the NMOS N2 are coupled together and with the internal circuit 2000. The sources of the PMOS P1 and the PMOS P2 are coupled with a power line $V_{cc}$. The sources of the NMOS N1 and the NMOS N2 are coupled with ground. In addition, the drains of the PMOS P1, the PMOS P2, the NMOS N1 and the NMOS N2 are coupled together and these drains are coupled with the pad 1000.

Referring to FIG. 1 again, a unused PMOS device P3, a unused NMOS device N3, a unused PMOS device P4 and a unused NMOS device N4 are coupled together and these devices are functionless during the discharging of the internal circuit 2000. The drains of the PMOS device P3, the PMOS device P4, the NMOS device N3 and the NMOS device N4 are coupled together with the pad 1000. Besides, the sources of the PMOS device P3 and the PMOS device P4 are coupled with the power line $V_{cc}$, and the source of the NMOS device N3 and the NMOS device N4 are coupled with ground. The gates of the PMOS device P3 and the PMOS device P4 are coupled with the power line $V_{cc}$ through a resistor RP3 and RP4, respectively. Besides, the gates of the NMOS device N3 and the NMOS device N4 are coupled with ground through a resistor RN3 and RN4, respectively.

Referring to FIG. 1, the power line $V_{cc}$ provides a voltage bias for the PMOS devices P1, P2, P3 and P4. Static charges are conducted from the internal circuit 2000 to ground through the NMOS devices N1 and N2.

Referring to FIG. 2, it is demonstrated a cross-section view of an NMOS device. The NMOS device has a gate oxide 110 on a substrate 100 and a gate 120 is formed on the gate oxide 110. Two N-type source/drain regions 200 and 210 are formed in the substrate 100 adjacent to the gate oxide 110. Besides, spacers 130 are formed on the sidewalls of the gate oxide 110 and the gate 120 and two N-type light doped drain (LDD) 220 are formed in the substrate 100 below the spacers 130. A positive power line $V_D$ is connected to one of the source/drain regions 200 to serve as a drain region and a power line $V_{ss}$ is connected to another one of the source/drain regions 210 to act as a source region. In this figure, a typical structure of an NMOS device is shown.

In general, the power line $V_{ss}$ of an NMOS device is connected to ground. When a voltage difference is applied between the gate 120 and the power line $V_D$, the fermi-energy band $E_F$ of the metal region A is raised. Furthermore, the voltage different includes a horizontal electrical field $E_h$ 300 and a vertical electrical field $E_v$ 310 and the vertical electrical field $E_v$ is applied to the N-type light doped drain regions 220. Referring to FIG. 3, it shows an energy-band diagram of an NMOS device during a positive voltage is applied on the gate. In this figure, the metal region of an NMOS device is in the region A, the oxide region of this is in the region B and the semiconductor region of this is in the region C. The semiconductor region C has four energy bands to represent the energy-band characteristic of the region. The energy bands include an eigen-energy band $E_i$, a conducting-energy band $E_C$, a Fermi-energy band $E_F$ and a valence-energy band $E_v$. When a positive voltage difference is applied on the metal region A, the valence band of the region C is raised. The valence band in the interface state between the region B and the region C may be higher than the conduction band of the region A. Thus, electrons on the interface state can move from the valence band to the conduction band and these electrons flow out from the drain. This phenomenon is indicated as the band-to-band tunneling. As electrons move from the valence band to the conduction band, electrical holes are produced at the same time. The holes will be accelerated by the horizontal electrical field $E_h$ 300 and these holes become hot carriers. Additionally, the energy of the hot carriers is high enough to tunnel through the region B, the oxide layer, and into the region A. The hot carriers will accumulate on the gate region. Therefore, electrons can easily cross over the barrier layer in the region B from the region A to the region C.

Referring to FIG. 4, it demonstrates a curve that is the relation of the gate voltage $V_g$ to the drain current $I_d$ in an NMOS device. As the gate voltage $V_g$ is less than −0.3 volts, the drain current $I_d$ raises up and it is indicated as a band-to-band tunneling current. That is, the band-to-band tunneling current is a flow of the electrons, which are on the interface state, through the energy gap between the valence band and the conduction band into the drain. Simultaneously, some electrical holes are produced and these holes are accelerated so as to become the hot holes. Because the energy of the hot holes is very high, these holes can tunnel through the oxide layer. Thus, the current is typically caused by positive charges accumulated on the gate region of the device.

Referring to FIG. 5, it shows a voltage-time curve diagram of an NMOS device that an electrostatic discharge (ESD) pulse is applied. Besides, the gate of the NMOS device is floating and it is not coupled with any power line. During the experiment, the ESD pulse is input into the drain of an NMOS device, the floating voltage of the gate and the drain is simultaneously measured. Besides, the total width of the device is 150 or 400 micrometers. For the total width 150 micrometers NMOS under an HBM ESD pulse, the voltage on the drain and the gate is demonstrated in the curve A and B, respectively. For the total width 400 micrometers under an HBM ESD pulse, the floating voltage of the drain and the gate is presented in the curve C and D, respectively. During an ESD pulse is input into the drain, the gate is floating and the ESD pulse input into the drain is about 500 volt. After the voltage on the drain is drop down, the voltage on the gate still maintains at a positive level. That is, even an ESD pulse had been output from the drain, a positive voltage is still induced in the gate. Consequently, the phenomenon proves that the above theory is right. As an NMOS device is operated during the electrostatic discharge, the electrical holes accumulate in the gate to induce a positive voltage difference.

Referring to FIG. 6, it shows two voltage-time curve diagram of an NMOS device. An ESD pulse is input into the drain of an NMOS device and the gate of the NMOS device is floating. As the input ESD pulse is about 1000 volt and 1500 volt, the voltage of the gate is demonstrated by the curve A and the curve B according to FIG. 6, respectively. As mentioned in FIG. 6, after an ESD pulse input into an ESD protection device, the maximum voltage difference in the device could reach 16 volts and the period of the maximum is longer as the voltage pulse is higher. As the ESD voltage input into the device is about 1 kV, the period of the maximum voltage is about 3 nanoseconds. Furthermore, the ESD voltage input into the device is about 1.5 kV, the period of the maximum voltage is about 10 nanoseconds.

According to the above discussion, the ESD protective circuit using NMOS device has a band-to-band tunneling issue. When a positive voltage is applied on the gate of the NMOS device, the channel of the device is turned on and the static charges mainly flow out from the turn-on channel. The current will localize on the channel and that damages the device. Thus, a new ESD protective circuit is needed for preventing the NMOS device of the circuit from destroyed.

SUMMARY OF THE INVENTION

For preventing the damage by the electrostatic discharge (ESD), it is defined that the total length of NMOS transistors or PMOS transistors must be longer than a threshold value. But, another issue about designers is that how much the driving current is output from a pair of an NMOS and a PMOS device. For example, an NMOS or PMOS may have eight polysilicon lines, the length of a polysilicon line is supposed to be 30 micrometers and the total length of the polysilicon lines is about 240 micrometers. If a pad output a current about 2 miliampers, one polysilicon line of an NMOS and PMOS device is connected with the internal circuit. In addition, other seven polysilicon lines of the NMOS device is connected with a $V_{ss}$ power line and other seven polysilicon lines of the PMOS device is connected with a $V_{DD}$ power line. If a pad must output a current about 4 miliampers, two polysilicon lines of each of the NMOS devices and the PMOS devices are connected with the internal circuit and the other seven polysilicon lines of each of the NMOS devices and the PMOS devices are respectively connected with the $V_{ss}$ power line and the $V_{DD}$ power line.

The ESD protective circuit further comprises several second pairs, each of which is consisted of an unused PMOS device and an unused NMOS device. The sources of the unused PMOS devices and the unused NMOS devices are respectively connected to a $V_{cc}$ power line and ground, respectively. The drains of the unused devices are connected to the drains of the used devices and to the pad. The gates of the unused PMOS devices and the unused NMOS devices are respectively connected to the $V_{cc}$ power line and connected to ground through a resistor.

An NMOS device is connected to the internal circuit and the used devices for discharging positive charges accumulated on the gates of the used NMOS devices. The drain of the NMOS device is connected to the internal circuit and to the gates of the used devices. The source of the NMOS device is connected to ground. The gate of the NMOS device is connected to the power line through a diode and it is connected to the second source/drain through a resistor to ground.

As an ESD pulse is input into the ESD protective circuit, the voltage level of the $V_{cc}$ power line is raised and a breakdown occurs in the diode. Furthermore, a positive voltage is applied to the gate of the NMOS device to turn on the channel. The positive charges from the internal circuit will be conducted into ground through the NMOS device so as to prevent the turning-on of the channel in the used NMOS devices.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses an electrostatic discharge (ESD) protective circuit that can reduce the undesired turn-on of the channel of NMOS devices in the ESD circuit. An NMOS device is connected between an internal circuit and a pad. The gate of the NMOS device is connected to a power line, which provides a voltage bias for the ESD protective circuit. When an ESD pulse is input into the circuit, a positive voltage is applied on the gate of the NMOS device to turn on the channel of the NMOS device. Thus, positive charges coming from the internal circuit is conducted to ground through the NMOS device.

Figure 7:
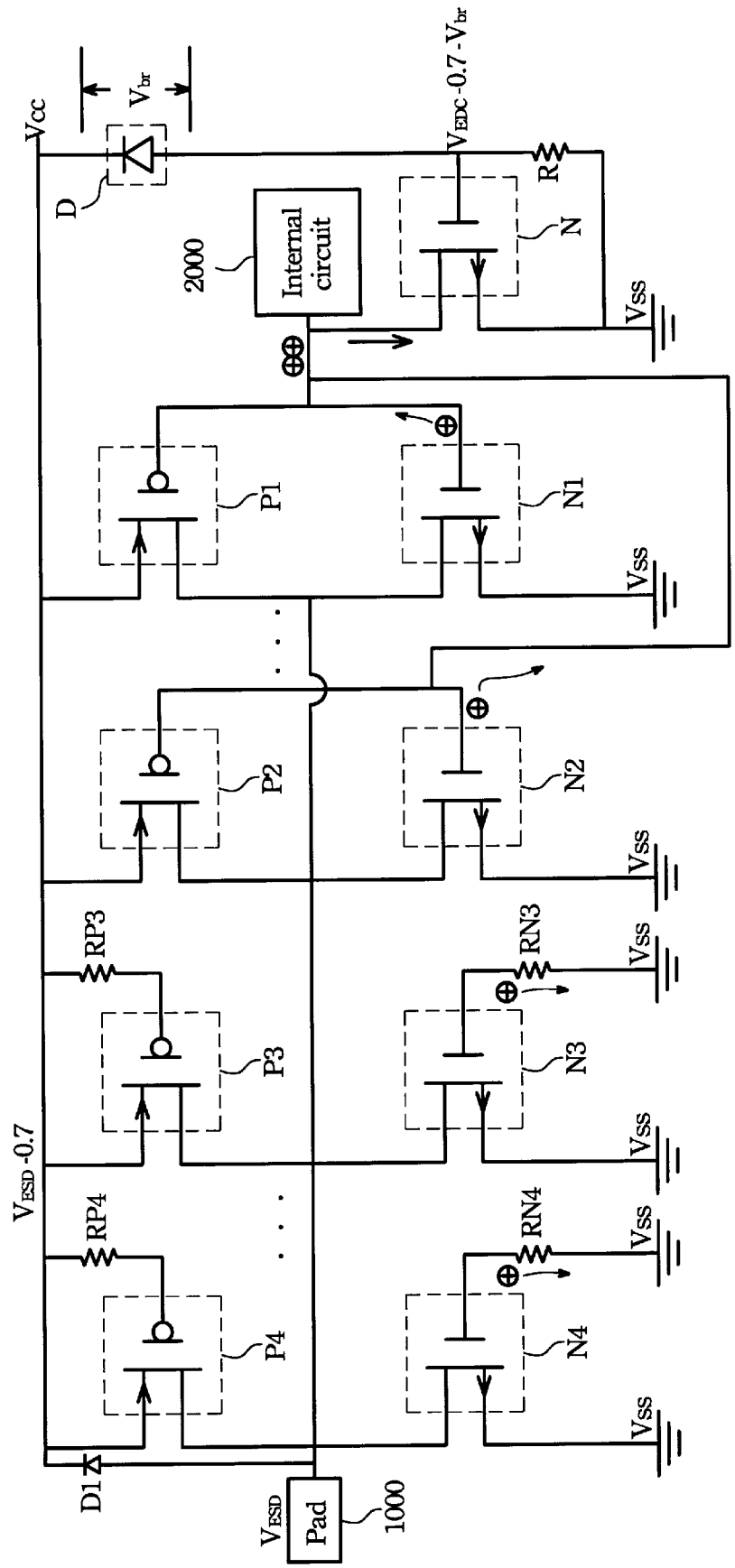
FIG. 7 is a schematic diagram of an electrostatic discharge circuit between an internal circuit and a pad in accordance with the present invention.

Referring to FIG. 7, an ESD protective circuit is demonstrated. The ESD protective circuit includes several pair of a used NMOS device and a used PMOS device, and several pair of an unused NMOS device and an unused PMOS device. A power line $V_{cc}$ is connected the used PMOS devices and the unused PMOS device to provide a bias voltage for the devices. A pad 1000 is connected to the drain of the all devices to input or output signal into the all devices and an internal circuit 2000 is connected to the used device for discharging electrostatic charge. Between the used devices and the internal circuit 2000, an NMOS device is coupled with ground for discharge positive charge on the gate of the used NMOS devices. In detail, the positive charges are produced by apply static charges on the NMOS device.

Referring to FIG. 7 again, each pair of the used devices includes a used NMOS device and a used PMOS device. The drains of the used devices are connected together with the pad 1000. The sources of the used PMOS device and the used NMOS device are respectively connected to the $V_{cc}$ power line and ground. The gates of the used devices are connected together with the internal circuit 2000. Besides, the gates of the used devices are connected to the first source/drain of an NMOS device N and the source/drain is connected to the internal circuit 2000. The second source/drain of the NMOS device N is connected to ground and the gate of the NMOS device N is connected to the $V_{cc}$ power line through a diode D. Besides, the gate is connected to ground through a resistor R for discharging.

The used NMOS device includes the NMOS device N1 and N2, the used PMOS device includes the PMOS device P1 and P2. Nevertheless, the number of the used-device pairs is not limited and it depends on the practical need in the design of integrated circuits. A used NMOS device and a used PMOS device are formed of a complementary metal oxide semiconductor (CMOS) device for output a driving current from the drains. A CMOS device can generally output a driving current supposed to be about 2 miliampers (mA) and the current are output from the pad 1000. If the ESD protective circuit must output a driving current about 6 miliampers, three used CMOS devices are needed in the circuit.

Still referring to FIG. 7, the ESD protective circuit has several pairs of unused CMOS devices, which are consisted of unused PMOS devices and unused NMOS devices. The drains of an unused PMOS device and an unused NMOS device are connected together and to the pad 1000 and the drains of the used devices. The sources of the unused PMOS and NMOS device are respectively connected to the $V_{cc}$ power line and ground. According to FIG. 7, the unused PMOS devices encompass the PMOS device P3 and P4, and the unused NMOS devices encompass the NMOS device N3 and N4. The gates of the PMOS P3 and P4 are connected to the $V_{cc}$ power line through a resistor RP3 and RP4, respectively. Besides, the gates of the NMOS N3 and N4 are connected to ground through a resistor RN3 and RN4, respectively. The unused devices in the ESD protective circuit do not output any driving current.

Still referring to FIG. 7, an NMOS device N is connected between the internal circuit 200 and the used devices for discharging positive charges accumulated on the gates of the used devices. A first source/drain of the NMOS device N is connected to the internal circuit 2000 and to the gates of the used devices. A second source/drain of the NMOS device N is connected to ground for discharging. The gate of the NMOS device N is connected to the $V_{cc}$ power line through a diode D and to the second source/drain of the NMOS device N through a resistor R. In detail, the negative terminal of the diode is connected to the VCC power line and the positive terminal of the diode is connected to the gate of the NMOS device N.

Figure 1:
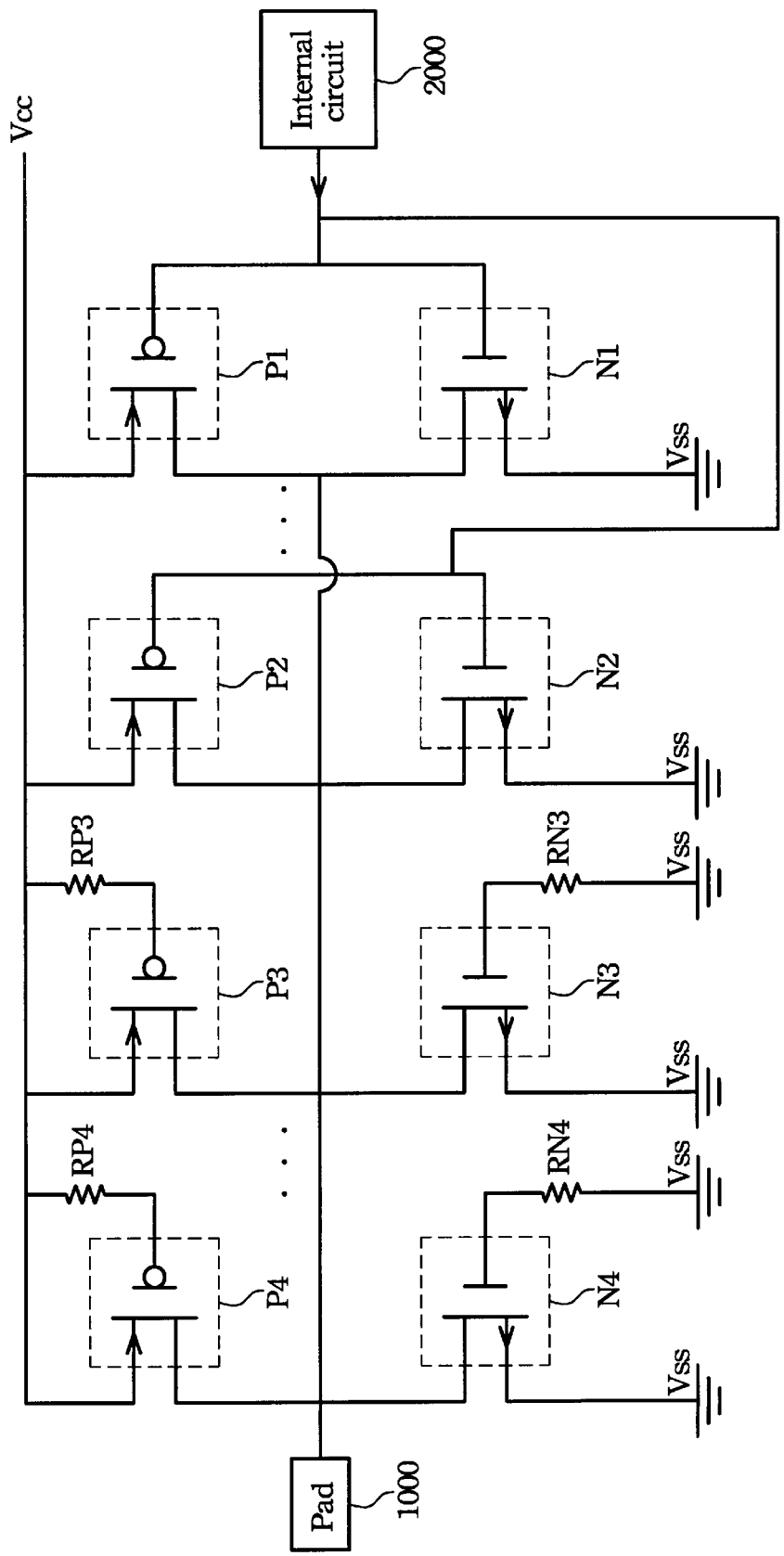
FIG. 1 shows a schematic diagram of an electrostatic discharge (ESD) protective circuit between an internal circuit and a pad in accordance with prior art.
Figure 2:
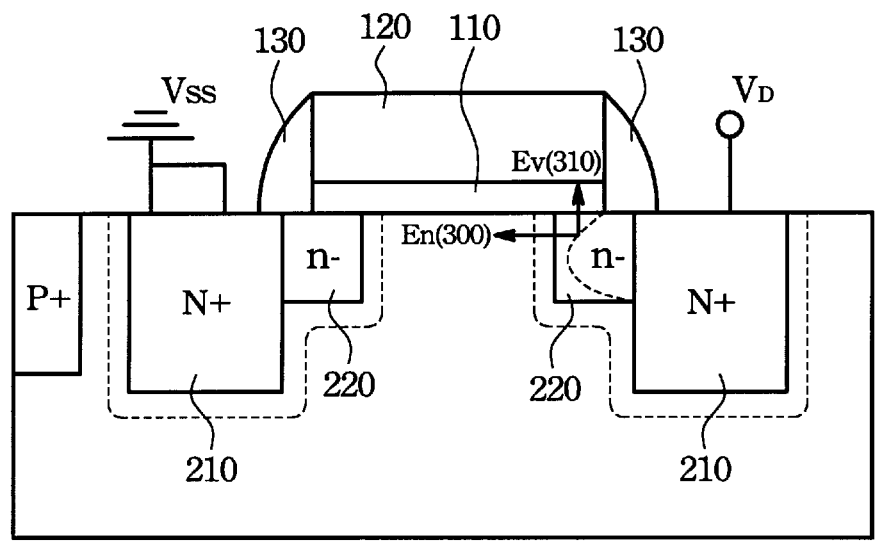
FIG. 2 shows a cross sectional view of an NMOS device of the electrostatic discharge (ESD) protective circuit in accordance with prior art.
Figure 3:
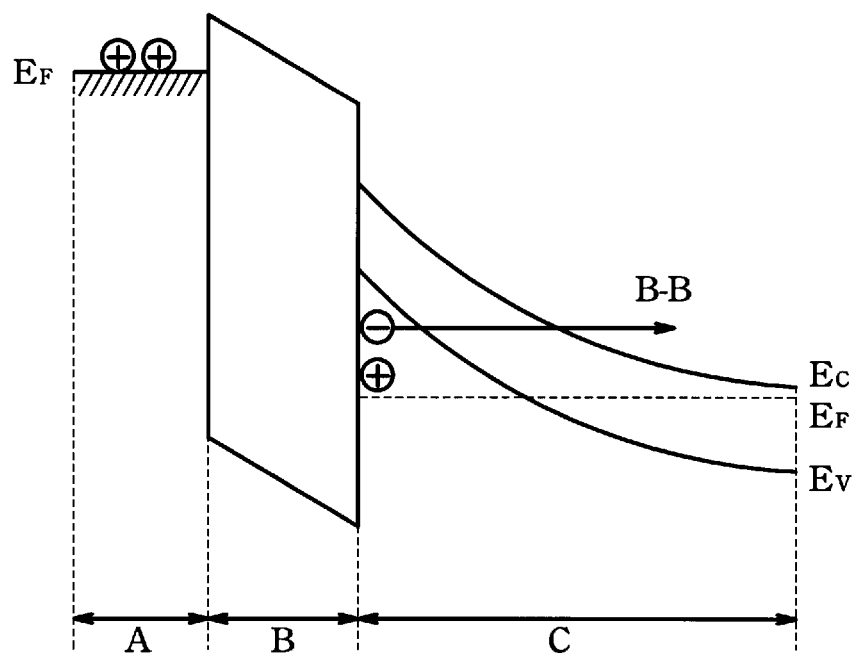
FIG. 3 shows a schematic energy-band diagram of an NMOS device when an electrical field is applied between the metal region and the substrate region of the NMOS device in accordance with prior art.
Figure 4:
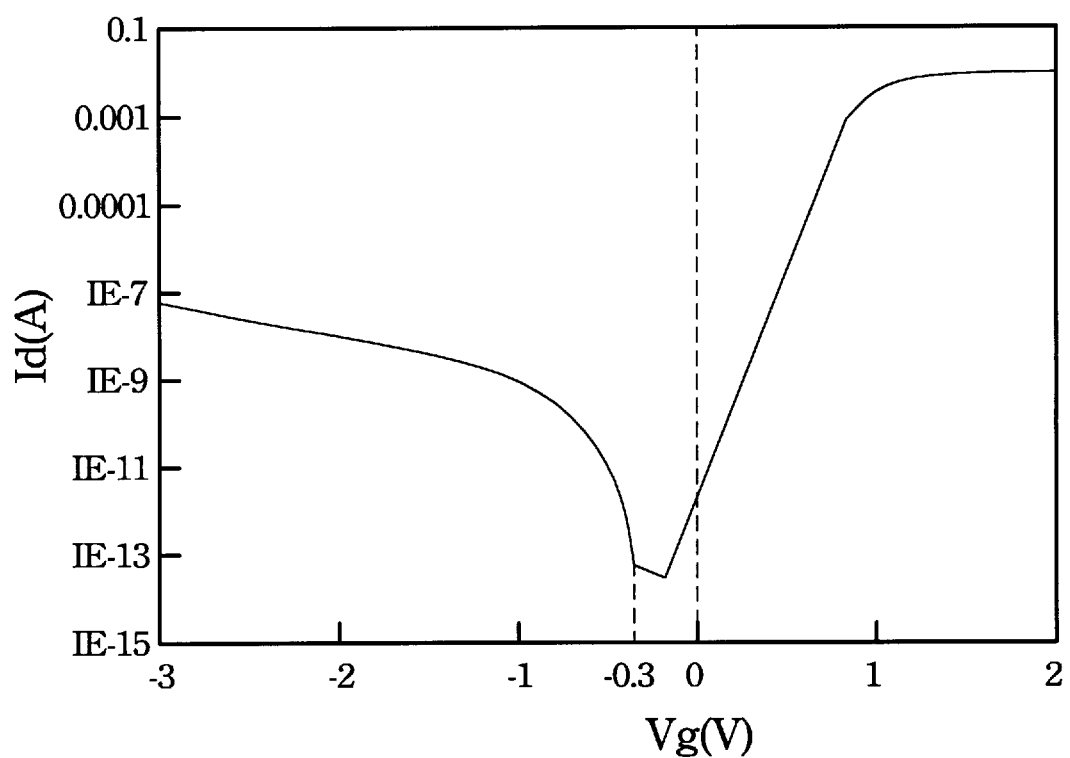
FIG. 4 is a current to voltage diagram of an NMOS device in accordance with prior art.
Figure 5:
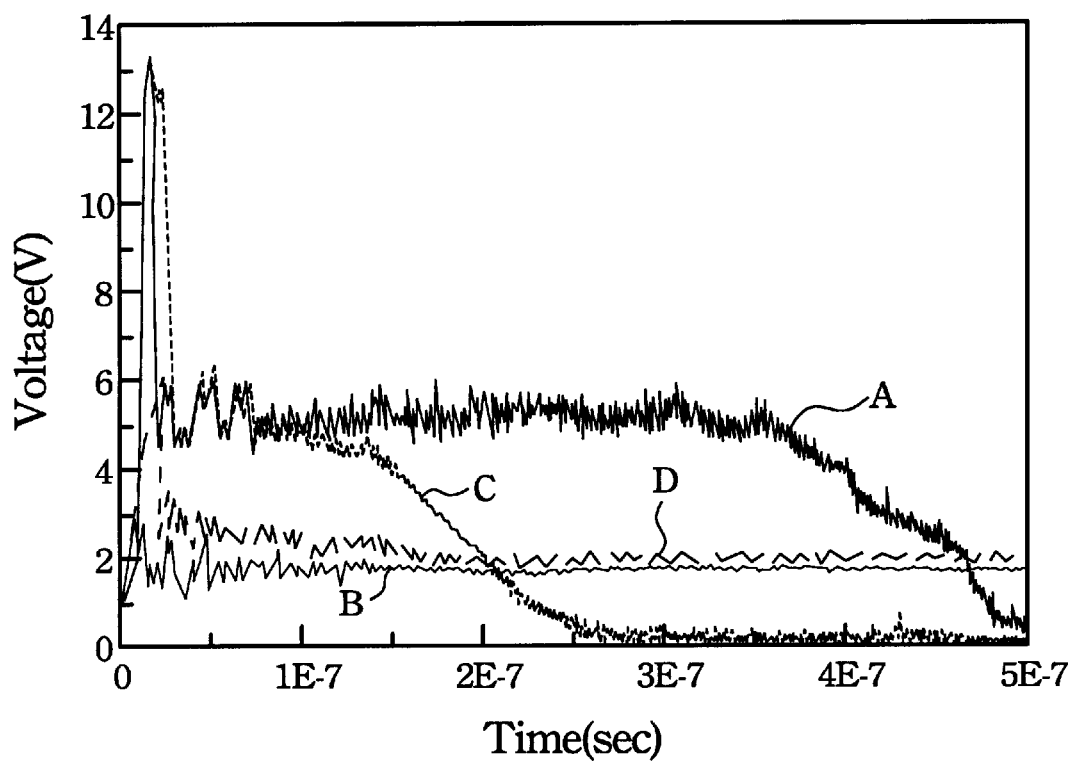
FIG. 5 is a curve diagram that shows the relation between a voltage on a gate of an NMOS device and time, as a voltage pulse is input to the drain of the NMOS device in accordance with prior art.
Figure 6:
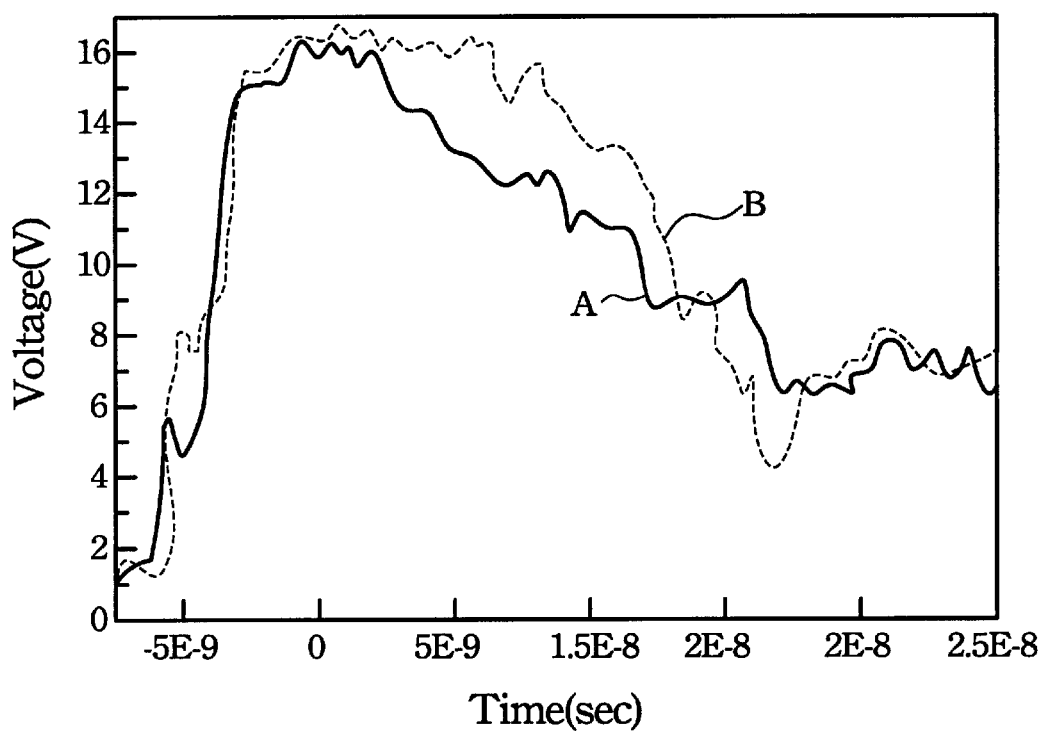
FIG. 6 is a curve diagram that demonstrates the relation between a voltage on an ESD protective circuit and time, when an ESD voltage pulse is input into the circuit.

As an ESD pulse inputs into the ESD protective circuit, the voltage level on the pad is higher than 16 volts, as mentioned as FIG. 6. In spite of that the $V_{cc}$ power line is floating, the PMOS device has a parasitic diode, which is the diode D1 according to FIG. 7, and the diode D1 is forward-bias. The voltage level on the $V_{cc}$ power line reaches a level about 16–0.7 volts. Besides, the diode D that is fabricated by using typical CMOS process has a breakdown voltage about 12 volts. Thus, the voltage level of the gate of the NMOS device is raised and it is about 16–0.7–12=3.3 volt, as mentioned in FIG. 7. Therefore, the channel of the NMOS device is turned on. Positive charges input the gates of the used devices from the internal circuit 2000 are conducted to ground through the channel of the NMOS device N. Thus, the channels of the used NMOS devices N can not be turn on so as to prevent from that currents accumulated in the channel of the used NMOS devices N, such that the devices could not be damaged.

While the preferred embodiment of the invention has been illustrated and described, it will be appreciated that various changes can be made therein without departing from the spirit and scope of the invention.

What is claimed is:

1. An electrostatic discharge (ESD) protective circuit for outputting a current, said circuit comprising:

at least one discharging circuit pair composed of a used NMOS device and a used PMOS device, wherein a gate of each of said used NMOS device and said used PMOS device coupled with an internal circuit and a drain of each of said used NMOS device and said used PMOS device coupled with a pad, a source of each of said PMOS device coupled with a power line and a source of each of said NMOS device coupled with ground; and discharging means for discharging positive charges accumulated on said gate of said used NMOS devices, wherein said discharging means connected to said internal circuit and said discharging circuit pair to prevent said used NMOS devices from turn-on turning-on.

2. The circuit according to claim 1, wherein said discharging means comprises an discharging NMOS device, a drain of said NMOS device coupled with said internal circuit, a source coupled with ground, and a gate of said NMOS device coupled with said power line through a diode and coupled with ground through a resistor.

3. The circuit according to claim 2, wherein a positive terminal of said diode is coupled with said discharging means and a negative terminal of said diode is coupled with said power line.

4. The circuit according to claim 1, wherein said discharging circuit pair output a driving current from said pad.

5. The circuit according to claim 4, wherein a value of said driving current is determined by a total number of said discharging pair.

6. An electrostatic discharge (ESD) protective circuit for outputting a current, said circuit comprising:

at least one discharging circuit pair composed of a used NMOS device and a used PMOS device, wherein a gate of each of said used NMOS device and said used PMOS device coupled with an internal circuit and a drain of each of said used PMOS device coupled with a pad, a source of each of said used PMOS device coupled with a power line and a source of each of said used NMOS device coupled with ground;

at least one discharging pair of an unused NMOS device and an unused PMOS device, wherein a drain of each of said unused NMOS device and said unused PMOS device coupled together with said pad and said drain of said used NMOS device and said used PMOS device, a source of each of said unused PMOS device coupled with said power line, a gate of said unused PMOS device coupled with said power line through a first resistor, a source of each of said unused NMOS device coupled with ground and said gate of each of said unused NMOS device coupled with ground through a second resistor; and discharging means for discharging positive charges accumulated on said gate of said used NMOS devices, wherein said means connected to said internal circuit and said used devices to prevent channels of said used NMOS devices from turning-on.

7. The circuit according to claim 6, wherein said discharging means comprises a discharging NMOS device, a drain of said discharging NMOS device coupled with said internal circuit, a source of said discharge NMOS device coupled with ground and, a gate of said discharge NMOS device coupled with said power line through a diode and coupled with ground through a third resistor.

8. The circuit according to claim 7, wherein a positive terminal of said diode is coupled with said discharging means and a negative terminal of said diode is coupled with said power line.

9. The circuit according to claim 6, wherein said discharging circuit pair of said used NMOS device and said PMOS device output a driving current from said pad.

10. The circuit according to claim 9, wherein a value of said driving current is determined by a total number of said discharging circuit pair of said used NMOS device and said used PMOS device.

11. An electrostatic discharge (ESD) protective circuit for outputting a current, said circuit comprising:

at least one discharging circuit pair composed of a used NMOS device and a used PMOS device, wherein a gate of each of said used NMOS device and said used PMOS device coupled with an internal circuit and a drain of said used NMOS device and said used PMOS device coupled with a pad, a source of each of said used PMOS device coupled with a power line and a source of each of said used NMOS device coupled with ground;

at least one discharging circuit pair of a unused NMOS device and a unused PMOS device, wherein a drain of each of said unused NMOS device and said unused PMOS device coupled with said pad and said drain of said used NMOS device and said used PMOS device, a source of each of said unused PMOS device coupled with said power line, a gate of said unused PMOS device coupled with said power line through a first resistor, a source of each of said unused NMOS device coupled with ground and said gate of each of said unused NMOS device coupled with ground through a second resistor; and a discharging NMOS device for discharging positive charges on said gate of said used NMOS devices to prevent the channel of said used NMOS device from turn-on, wherein a drain of said discharging NMOS device coupled with said internal circuit, a source of said discharging NMOS device coupled with ground, and a gate of said discharging NMOS device coupled with said power line through a diode and coupled with ground through a third resistor.

12. The circuit according to claim 11, wherein said discharging circuit pair of said used NMOS devices and said used PMOS devices output a driving current from said pad.

13. The circuit according to claim 12, wherein a value of said driving current is determined by a total number of said discharging circuit pairs of said used NMOS device and said PMOS device.

14. The circuit according to claim 11, wherein a positive terminal of said diode is coupled with said discharging NMOS device and a negative terminal of said diode is coupled with said power line.

\* \* \* \* \*